(12) United States Patent
Zhou et al.

(10) Patent No.: US 12,392,816 B1
(45) Date of Patent: Aug. 19, 2025

(54) PULSE LASER IRRADIATION WIDE BANDGAP POWER DEVICE

(71) Applicant: NANJING UNIVERSITY, Nonjing (CN)

(72) Inventors: Feng Zhou, Nanjing (CN); Junfan Qian, Nanjing (CN); Hai Lu, Nanjing (CN); Weizong Xu, Nanjing (CN); Dong Zhou, Nanjing (CN); Fangfang Ren, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 19/002,737

(22) Filed: Dec. 27, 2024

(30) Foreign Application Priority Data

Jun. 3, 2024 (CN) .......................... 202410704305.4

(51) Int. Cl.
*G01R 31/265* (2006.01)
*G01R 31/00* (2006.01)

(52) U.S. Cl.
CPC ....... *G01R 31/2656* (2013.01); *G01R 31/003* (2013.01)

(58) Field of Classification Search
CPC .......................... G01R 31/003; G01R 31/2656
USPC ...................................................... 324/754.23
See application file for complete search history.

(56) References Cited

FOREIGN PATENT DOCUMENTS

| CN | 107656185 A | 2/2018 |
|---|---|---|
| CN | 113125930 A | 7/2021 |
| CN | 117706317 A | 3/2024 |
| CN | 118068155 A | 5/2024 |

*Primary Examiner* — Eman A Alkafawi
*Assistant Examiner* — Rahul Maini
(74) *Attorney, Agent, or Firm* — Ming Jiang; OPENPTO US LLC

(57) ABSTRACT

The present invention discloses an experimental apparatus and a test method for a pulse laser irradiation wide bandgap power device. The apparatus includes an optical path coupling system, a circuit test system, a temperature control system, and an interaction control system. According to the present invention, irradiation sensitive region locating, irradiation transient current tests, irradiation sensitive condition tests, and irradiation degradation tests for the wide bandgap power device are implemented, and advantages of convenience in experiments, simple operation, automated tests, comprehensive and accurate test results, and the like are achieved.

5 Claims, 4 Drawing Sheets

PULSE LASER IRRADIATION WIDE BANDGAP POWER DEVICE

CROSS-REFERENCE TO RELATED APPLICATIONS

The present application claims priority benefits to Chinese Patent Application No. 202410704305.4 filed on Jun. 3, 2024, which is incorporated herein by reference in its entirety.

TECHNICAL FIELD

The present invention relates to the technical fields of pulse laser irradiation for wide bandgap power devices and irradiation characteristic parameter tests for the wide bandgap power devices, and in particular, to an experimental apparatus and a test method for a pulse laser irradiation wide bandgap power device.

BACKGROUND

The third-generation wide bandgap semiconductor materials, represented by gallium nitride (GaN) and silicon carbide (SiC), have superior material characteristics. Wide bandgap power devices offer higher breakdown voltages, lower on-state resistance, and better thermal stability compared to traditional silicon devices, can significantly reduce the volumes, weights, and costs of passive devices, and improve the power density. Moreover, the wide bandgap power devices have better resistance to displacement damage and total dose effect, making them the core devices of the next-generation aerospace power supplies. However, the aerospace application of the wide bandgap power devices faces problems such as space irradiation damage and poor reliability, and the mechanism of irradiation failure in these devices needs further study. Therefore, it is urgent to develop an experimental apparatus and a test method for a pulse laser irradiation wide bandgap power device.

Since the traditional wide bandgap semiconductor irradiation experiments are conducted in apparatuses such as neutron sources, proton sources, and heavy ion sources, the problems of limited experimental machine hours and high experimental costs arise. In addition, because test apparatuses in irradiation chambers need to be located far away from tested devices and properly protected, testers are unable to operate directly in the irradiation chambers, which leads to low accuracy of test data, low test efficiency of irradiation experimental apparatuses, poor reliability, and inability to comprehensively evaluate the irradiation characteristics of the devices, etc. Conducting scientific research on devices through pulse laser irradiation is an experimental method developed in recent years. However, existing pulse laser irradiation experimental apparatuses for the wide bandgap power devices still have a series of problems as follows, for example, positions of sensitive regions cannot be automatically located, the high-bandwidth transient pulse current generated by irradiation cannot be easily and accurately captured, the electrical characteristics of the devices before and after the irradiation cannot be quickly evaluated, the irradiation sensitive conditions under pulse laser cannot be comprehensively determined, and the irradiation resistance of the devices cannot be evaluated under power conditions.

SUMMARY

In view of the shortcomings of the prior art, the present invention proposes an experimental apparatus and a test method for a pulse laser irradiation wide bandgap power device, in order to solve the problems that coordinates of sensitive regions of the device cannot be accurately located, irradiation high-frequency transient current at three ends of the device cannot be simultaneously acquired, sensitive conditions of the device cannot be comprehensively and accurately determined, basic electrical parameters of the device before and after irradiation cannot be acquired in real time, and irradiation resistance of the wide bandgap power device in harsh working conditions cannot be simulated.

To achieve the above objectives, the present invention provides a technical solution as follows.

An experimental apparatus for a pulse laser irradiation wide bandgap power device, comprising:

an optical path coupling system, configured to direct pulse laser onto a surface of a wide bandgap power device to be tested, regulate parameters of the pulse laser, control an incident position of the pulse laser, and feed back an image of a surface morphology of the wide bandgap power device;

a circuit test system, which is electrically connected to a gate, a drain, and a source of the wide bandgap power device through three probes of a probe station respectively, and is configured to perform an electrical characteristic test, a dynamic switching test, and a transient current test on the wide bandgap power device before and after irradiation;

a temperature control system, which includes a cavity for accommodating the wide bandgap power device and is configured to control a vacuum degree and a temperature in the cavity; and an interaction control system, which is connected to the optical path coupling system, the circuit test system, and the temperature control system through a communication cable respectively, and is configured to send a test instruction and acquire and feed back test data and images.

Further, the optical path coupling system includes a pulse laser control unit, an energy control unit, an image acquisition unit, and a piezoelectric displacement unit.

The pulse laser control unit includes a pulse laser device and is configured to control the pulse laser device to emit pulse laser.

The energy control unit includes a plurality of attenuation plates, a motor drive circuit, and an attenuation plate switching motor, and is configured to adjust a magnitude of single pulse energy.

The piezoelectric displacement unit includes three piezoelectric motor drive circuits, an X-axis piezoelectric motor, a Y-axis piezoelectric motor, and a Z-axis piezoelectric motor, and is configured to control scanning of the wide bandgap power device at a horizontal position and control a focusing depth of the wide bandgap power device.

The image acquisition unit includes a microscope camera, a chip illumination LED, and an environment illumination LED, and is configured to provide environment illumination and acquire images.

Still further, the circuit test system includes a drive control unit, a signal access selection unit, a dynamic switching test unit, a transient current test unit, an electrical characteristic test unit, and a waveform acquisition unit.

Still further, the temperature control system further includes a temperature control unit and a vacuum degree control unit.

The temperature control unit includes a heating table and is configured to control a temperature in the cavity where the wide bandgap power device is located.

The vacuum degree control unit includes a vacuum pump and is configured to control a vacuum degree in the cavity where the wide bandgap power device is located.

Still further, the interaction control system includes an FPGA and an operation control unit, the operation control unit is configured to acquire a test instruction from a tester, and the FPGA communicates with the operation control unit through a serial port and is connected to the optical path coupling system and the circuit test system through pins for sending a control instruction to units connected to each pin.

Still further, the drive control unit is connected to the wide bandgap power device through the probe station, and outputs a gate drive signal, a drain drive signal, and a source drive signal to the signal access selection unit based on the control instruction to control the wide bandgap power device which is connected to the signal access selection unit to access to the dynamic switching test unit, the transient current test unit, or the electrical characteristic test unit.

Still further, the dynamic switching test unit includes a complementary push-pull circuit composed of an NPN transistor and a PNP transistor, and an output end of the dynamic switching test unit is connected to the signal access selection unit and applies a voltage pulse to the wide bandgap power device based on an access signal.

Still further, the transient current test unit includes a gate bias tee circuit, a drain bias tee circuit, a source bias tee circuit, and a numerical control voltage source; an AC end of the gate bias tee circuit is connected to the waveform acquisition unit, a DC end thereof is connected to the numerical control voltage source, and a COM end thereof is connected to a gate control signal switch of the signal access selection unit; an AC end of the drain bias tee circuit is connected to the waveform acquisition unit, a DC end thereof is connected to the numerical control voltage source, and a COM end thereof is connected to a drain control signal switch of the signal access selection unit; and an AC end of the source bias tee circuit is connected to the waveform acquisition unit, a DC end thereof is connected to a GND, and a COM end thereof is connected to a source control signal switch of the signal access selection unit.

Still further, the electrical characteristic test unit is an IV test source meter, which is connected to and communicates with the operation control unit through a data line.

The present invention further proposes a test method for a pulse laser irradiation wide bandgap power device, which is implemented based on the above-mentioned experimental apparatus for the pulse laser irradiation wide bandgap power device. The method includes the following steps:

S1: adjusting an optical path coupling system to focus pulse laser onto a surface of a wide bandgap power device, placing the wide bandgap power device in a cavity of the temperature control system, and connecting a gate, a drain, and a source of the wide bandgap power device to an experimental apparatus using a probe station;

S2: presetting test conditions in an operation control unit by a tester, where the test conditions include: a laser wavelength, frequency, single pulse energy, a position of a rectangular region for scanning, a step size interval, and bias conditions of an electrical characteristic test unit;

S3: clicking a sensitive region scanning test button by the tester, accessing a wide bandgap power device to a circuit test system, enabling a pulse laser device in the optical path coupling system to be switched on, enabling a piezoelectric displacement unit to perform scanning according to the rectangular region and the step size set in step S2, enabling the electrical characteristic test unit of the circuit test system to acquire gate current and source current in real time simultaneously, and after completing a test, saving scanning images and data of a gate sensitive region and a drain sensitive region, and automatically locating a position of the drain sensitive region;

S4: setting magnitudes of a gate voltage and a drain voltage by the tester, and clicking a transient current test button, allowing that the pulse laser device receives a control signal to perform a single trigger at this time, and a waveform acquisition unit of the circuit test system performs a single capture simultaneously to obtain a high-frequency pulse current waveform of the wide bandgap power device under this gate voltage and drain voltage condition; and changing the gate voltage and the drain voltage, and repeating operation of this step to obtain transient photocurrent waveforms at different voltages;

S5: performing the following sensitive condition tests by the tester:

clicking a sensitive wavelength test button, enabling the pulse laser device to change the wavelength based on a bandgap width range of a material of the wide bandgap power device, and simultaneously, enabling the electrical characteristic test unit to acquire the magnitudes of the gate current and drain current of the wide bandgap power device at different wavelengths to determine a sensitive wavelength;

clicking a sensitive focusing depth test button, enabling the pulse laser device to change a focusing depth of the pulse laser based on set values, and simultaneously, enabling the electrical characteristic test unit to acquire the magnitudes of the gate current and the drain current of the wide bandgap power device at different wavelengths to determine a sensitive focusing depth;

clicking a sensitive single pulse energy test button, enabling the optical path coupling system to adjust a magnitude of single pulse energy, and simultaneously, enabling the electrical characteristic test unit to acquire the magnitudes of the gate current and the drain current of the wide bandgap power device at different wavelengths to determine sensitive single pulse energy;

clicking a sensitive bias voltage test button, setting a range of gate voltages and drain voltages to be tested, enabling the electrical characteristic test unit to scan the gate voltages and the drain voltages respectively, and simultaneously, enabling the electrical characteristic test unit to acquire the magnitudes of the gate current and the drain current of the wide bandgap power device at different wavelengths to determine a sensitive bias voltage; and clicking a sensitive temperature test button, setting a temperature range to be tested, enabling the temperature control unit to change different temperatures, and simultaneously, enabling the electrical characteristic test unit to acquire the magnitudes of the gate current and the drain current of the wide bandgap power device at different wavelengths to determine a temperature;

S6: before and after performing the sensitive condition test in step S5, accessing the wide bandgap power device to the electrical characteristic test unit to perform an electrical characteristic scanning test, and further obtaining degradation conditions of electrical characteristics of the wide bandgap power device under different sensitive conditions;

S7: clicking a dynamic switching test by the tester, and accessing the wide bandgap power device to a dynamic switching test unit; if a single dynamic switching test is selected, enabling the pulse laser device and a drive control unit to perform a single trigger, and simultaneously, enabling a waveform acquisition unit to perform a single capture so as to observe a waveform and determine whether the device fails; if the wide bandgap power device is normal, continuing to perform continuous dynamic switching tests, sending a PWM wave to the wide bandgap power device, enabling the pulse laser device to trigger at the same frequency as the PWM wave, and simultaneously, enabling the waveform acquisition unit to perform continuous acquisition so as to obtain irradiation resistance of the wide bandgap power device under the dynamic switching tests; and S8: completing all of the above-mentioned test processes as well as viewing and analyzing all experimental data by the tester through an interaction control system to determine the irradiation resistance of the wide bandgap power device under a pulse laser.

The present invention has the following beneficial effects.

1. According to the present invention, the sensitive conditions of the wide bandgap power device, such as a pulse laser wavelength, single pulse energy of the pulse laser, a pulse laser repetition frequency, a focal plane position of the pulse laser, a gate bias voltage and a drain bias voltage of the wide bandgap power device, and an environmental temperature can be comprehensively and automatically determined. Moreover, the present invention can perform a single test on a certain sensitive condition, or can automatically complete the tests of all sensitive conditions.

2. According to the present invention, transient pulse current waveforms of the gate, the drain, and the source are simultaneously obtained using the high-bandwidth waveform acquisition unit, so that the capture conditions of carriers deposited by the pulse laser at each electrode over time can be understood; and at the same time, the measurement bandwidth reaches 10 GHz, and all channels are matched with 50 ohm impedance, achieving low waveform distortion.

3. According to the present invention, the piezoelectric displacement unit with a minimum step size of 0.1 microns is adopted for scanning, so that the positions of the sensitive regions of the wide bandgap power device can be automatically and accurately located, relevant tests can be performed, and meanwhile, the images of the gate current and the drain current changing with a plane position can be obtained.

4. The experimental device of the present invention will perform electrical characteristic measurement before and after the pulse laser irradiation tests, and thus the degradation conditions of the wide bandgap power device under such irradiation conditions can be understood.

5. The system is easy and convenient to operate and user-friendly in human-computer interaction. After the test buttons are clicked, all test steps can be automatically completed and data can be automatically saved; in addition, the system also supports the test of an entire 8-inch wafer, allowing for the fully-automatic pulse laser irradiation test of hundreds of devices without manually switching the tests.

DETAILED DESCRIPTION OF THE EMBODIMENTS

1. The present invention solves the technical problem of how to test irradiation characteristics of a wide bandgap power device by providing an experimental apparatus and a test method for a pulse laser irradiation wide bandgap power device.

To better understand the technical solution of the present invention, a detailed description for the technical solution of the present invention will be provided below in conjunction with the accompanying drawings and specific embodiments.

Figure 1:
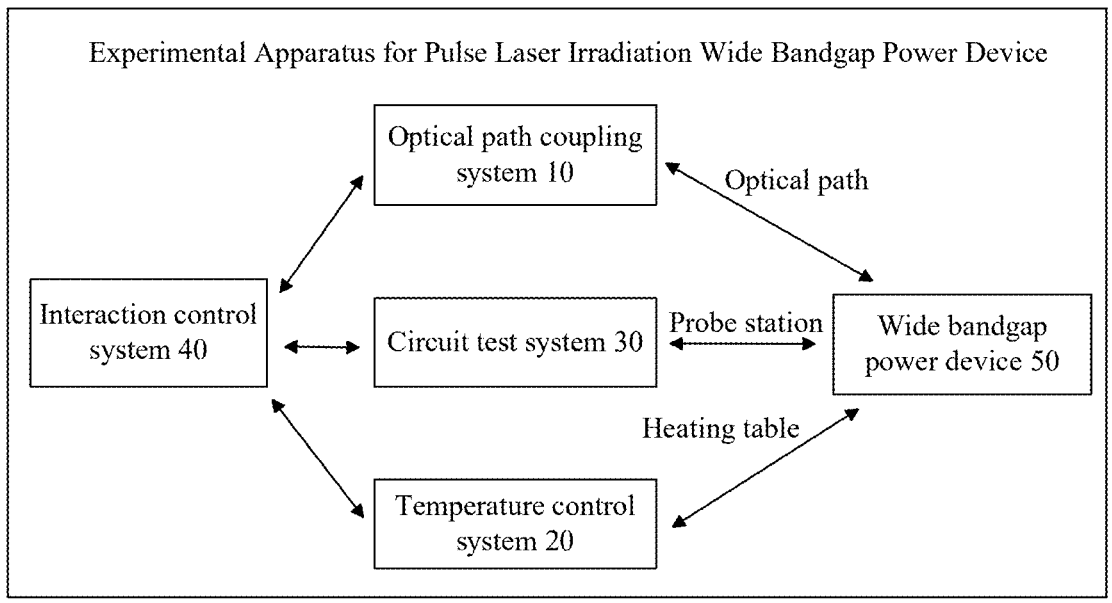
FIG. 1 is a schematic diagram of an overall system structure of an experimental apparatus for a pulse laser irradiation wide bandgap power device according to the present invention.

As shown in FIG. 1, an experimental apparatus for a pulse laser irradiation wide bandgap power device proposed by embodiments of the present invention includes an optical path coupling system 10, a temperature control system 20, a circuit test system 30, and an interaction control system 40. The optical path coupling system 10 emits pulse laser, directs the pulse laser onto a surface of a wide bandgap power device 50, and is configured to regulate parameters of the pulse laser, control an incident position of the pulse laser, and feed back an image of a surface morphology of the wide bandgap power device 50. The temperature control system 20 includes a cavity for accommodating the wide bandgap power device 50 and is configured to control a vacuum degree and a temperature in the cavity. The circuit test system 30 is electrically connected to a gate, a drain, and a source of the wide bandgap power device 50 through three probes of a probe station 60 respectively, and is configured to perform an electrical characteristic test and a dynamic switching test on the wide bandgap power device and to capture irradiation transient pulse current for performing a transient current test on the wide bandgap power device before and after irradiation. The interaction control system 40 is connected to the optical path coupling system 10, the temperature control system 20, and the circuit test system 30 through a communication cable respectively, and is configured to send a test instruction and acquire and feed back test data and images.

Figure 2:
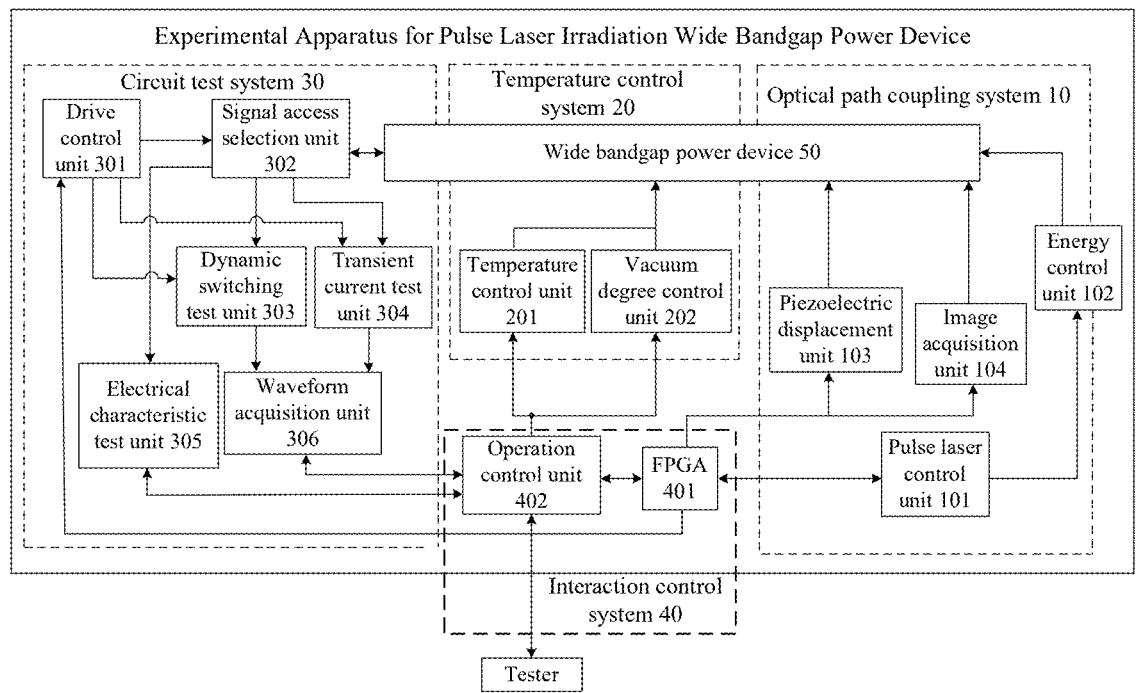
FIG. 2 is a schematic diagram of a specific unit structure of an experimental apparatus for a pulse laser irradiation wide bandgap power device according to the present invention.

As shown in FIG. 2, the optical path coupling system 10 in the embodiments of the present invention includes a pulse laser control unit 101, an energy control unit 102, a piezoelectric displacement unit 103, and an image acquisition unit 104.

The temperature control system 20 includes a cavity (not shown), a temperature control unit 201, and a vacuum degree control unit 202. An object stage is disposed in the cavity, and the wide bandgap power device 50 is placed on the object stage. The vacuum degree control unit 202 includes a vacuum pump located outside the cavity, the vacuum pump is connected to the cavity, and an operation control unit 402 is connected to the vacuum pump to control a vacuum degree in the cavity. The temperature control unit 201 includes a heating table, the heating table is located in the cavity, the object stage is located on the heating table, and the operation control unit 402 is connected to the heating table to control a temperature in the cavity.

The circuit test system 30 includes a drive control unit 301, a signal access selection unit 302, a dynamic switching test unit 303, a transient current test unit 304, an electrical characteristic test unit 305, and a waveform acquisition unit 306.

The interaction control system 40 includes an FPGA 401 and the operation control unit 402. The operation control unit 402 is configured to acquire a test instruction from a tester and send the test instruction to units connected thereto, so as to control the corresponding unit to perform corresponding operation. The FPGA 401 is connected to the optical path coupling system 10 and the circuit test system 30 through pins for sending a control instruction to units connected to each pin. The FPGA 401 communicates with the operation control unit 402 using a serial port, and the status of the FPGA 401 can be fed back to the tester through the operation control unit 402.

Figure 3:
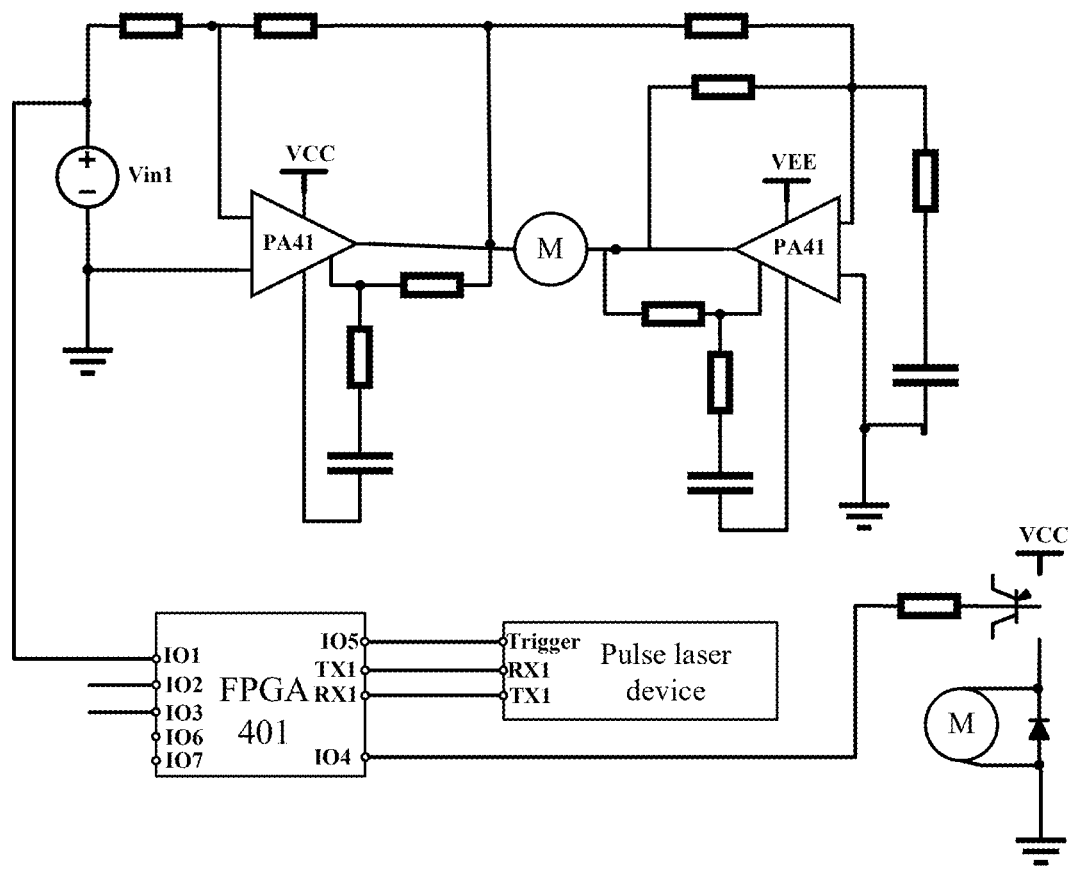
FIG. 3 is a circuit diagram where an optical path coupling system is connected to an FPGA.

Specifically, referring to FIG. 3, the pulse laser control unit 101 includes a pulse laser device, the pulse laser device is located outside the cavity for accommodating the wide bandgap power device 50 and is electrically connected to the FPGA 401 of the interaction control system 40. The FPGA 401 controls the pulse laser device to emit pulse laser, the emitted pulse laser is coupled through an optical path and then passes through the cavity to be irradiated onto the surface of the wide bandgap power device 50, and a focusing spot of a pulse laser beam has a diameter of 1 micron.

The energy control unit 102 includes a plurality of attenuation plates, a motor drive circuit, and an attenuation plate switching motor. The plurality of attenuation plates are mechanically connected to the attenuation plate switching motor. The attenuation plate switching motor is electrically connected to the motor drive circuit. The motor drive circuit is electrically connected to the FPGA 401 of the interaction control system 40. The attenuation plates are disposed on the optical path of the pulse laser, the single pulse energy of the pulse laser can be reduced by the attenuation plates, and different magnitudes of single pulse energy can be obtained by switching different attenuation plates through the attenuation plate switching motor. The FPGA 401 controls the motor drive circuit to drive operation of the attenuation plate switching motor to switch different attenuation plates, thereby adjusting the magnitude of single pulse energy of the pulse laser. The connection mode between the attenuation plate and the attenuation plate switching motor is not an innovative point of the present invention and is well known to those skilled in the art, so it will not be repeated here.

The piezoelectric displacement unit 103 includes three piezoelectric motor drive circuits, an X-axis piezoelectric motor, a Y-axis piezoelectric motor, and a Z-axis piezoelectric motor. The X-axis piezoelectric motor, the Y-axis piezoelectric motor, and the Z-axis piezoelectric motor are connected to the three piezoelectric motor drive circuits respectively. The three piezoelectric motor drive circuits are electrically connected to the FPGA 401 of the interaction control system 40. The FPGA 401 controls two of the piezoelectric motor drive circuits to drive operation of the X-axis piezoelectric motor and the Y-axis piezoelectric motor respectively so as to control the object stage on which the wide bandgap power device 50 is placed to move along an X-axis direction and a Y-axis direction, that is, to perform horizontal and vertical movements, thereby adjusting an incident position and a focal plane of the pulse laser, and achieving scanning of a horizontal position of the wide bandgap power device 50. The FPGA 401 controls another piezoelectric motor drive circuit to drive operation of the Z-axis piezoelectric motor so as to control the object stage on which the wide bandgap power device 50 is placed to move along a Z-axis direction, thereby achieving control of a focusing depth of the wide bandgap power device 50.

The image acquisition unit 104 includes a microscope camera, a chip illumination LED, and an environment illumination LED, where the microscope camera, the chip illumination LED, and the environment illumination LED are all connected to the FPGA 401. The microscope camera is configured to photograph the surface of the wide bandgap power device 50 and transmit a photographed image to the FPGA 401 via a data line, the chip illumination LED facilitates the tester to photograph the surface topography of the wide bandgap power device 50, and the environment illumination LED facilitates the tester to replace the wide bandgap power device 50.

In this embodiment, FIG. 3 shows a circuit diagram where the optical path coupling system 10 is connected to the FPGA 401. As shown in the figure, an IO1 pin of the FPGA 401 is configured as an output end of a digital-to-analog converter inside the FPGA 401 and is connected to an input voltage end Vin1 of a piezoelectric motor drive circuit. Different voltages are output through the IO1 pin to drive the X-axis piezoelectric motor, achieving the movement of the wide bandgap power device 50 along the X-axis direction. Similarly, an IO2 pin and an IO3 pin of the FPGA 401 are respectively connected to input voltage ends Vin2 and Vin3 of the other two piezoelectric motor drive circuits to drive the Y-axis piezoelectric motor and the Z-axis piezoelectric motor respectively, achieving the movement of the wide bandgap power device along the Y-axis direction and the Z-axis direction. An RX1 port, a TX1 port, and a Trigger port of the pulse laser device are connected to a TX1 pin, an RX1 pin, and an IO5 pin of the FPGA 401 respectively. The RX1 port and the TX1 port adopt a serial port communication manner, have a Baud rate configured at 115,200 bps, and are configured to control the repetition frequency and wavelength of the pulse laser device respectively. The Trigger port is configured to control switch-on and switch-off of the pulse laser device. In a single trigger mode, the IO5 pin outputs a single pulse square wave with a high level of 3.3 V and a low level of 0 V. In a continuous trigger mode, the IO5 pin outputs a PWM wave with a high level of 3.3 V and a low level of 0 V. An IO4 pin of the FPGA is connected to the motor drive circuit. When the IO4 pin of the FPGA 401 is given a low-level pulse of 100 microseconds, the attenuation plate switching motor completes a switching, thereby changing the single pulse energy of the pulse laser emitted by the pulse laser device. An IO6 pin of the FPGA is connected to the chip illumination LED, and an IO7 pin thereof is connected to the environment illumination LED so as to control the switch-on and switch-off of the chip illumination LED and the environment illumination LED. The microscope camera is connected to the FPGA 401 through the data line to achieve an image transmission function. It should be noted that since the Y-axis piezoelectric motor and the piezoelectric motor drive circuit thereof as well as the Z-axis piezoelectric motor and the piezoelectric motor drive circuit thereof are similar in composition and connection modes to that of the X-axis piezoelectric motor and the piezoelectric motor drive circuit thereof, they are not illustrated in FIG. 3.

Figure 4:
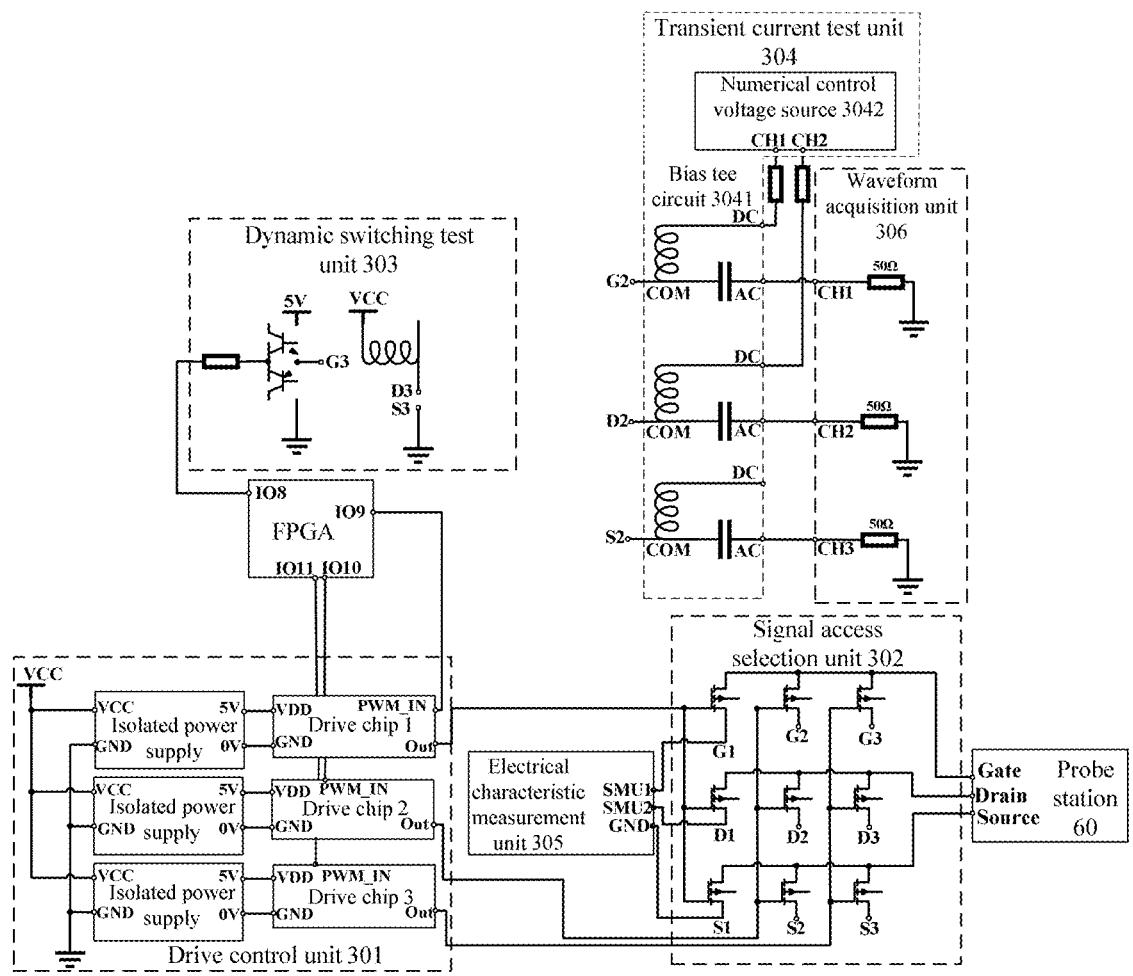
FIG. 4 is a circuit diagram where a circuit test system is connected to an FPGA and a probe station.

As shown in FIG. 4, in the circuit test system 30 of this embodiment, the drive control unit 301 is connected to the FPGA 401. The drive control unit 301 receives control signals sent by the FPGA 401, and outputs three paths of isolated drive signals, namely, a gate drive signal, a drain drive signal, and a source drive signal, to the signal access selection unit 302. The signal access selection unit 302 is connected to the wide bandgap power device 50, for controlling the wide bandgap power device 50 to selectively access to the electrical characteristic test unit 305, access to the dynamic switching test unit 303, or access to the transient current test unit 304.

The dynamic switching test unit 303 is configured to perform dynamic switching tests on the wide bandgap power device 50. In this embodiment, the dynamic switching test may adopt, for example, a double-pulse test method to control a repeated switching process of the wide bandgap power device, so as to test the degradation conditions of parameters such as the dynamic resistance and switching time of the wide bandgap power device during the repeated switching process, and further to analyze the mechanism of the wide bandgap power device. The transient current test unit 304 is configured to perform transient current tests on the wide bandgap power device 50. In this embodiment, the transient current test is to connect the transient current test unit 304 to the gate, the drain, and the source of the wide bandgap power device, and in the test process, the transient current test unit 304 records gate-to-source current and drain-to-source current which can be used to determine the degradation conditions of the operation ability of the wide bandgap power device after pulse laser irradiation and provide a basis for subsequent analysis. The electrical characteristic test unit 305 is configured to perform subsequent electrical characteristic tests on the wide bandgap power device 50, to obtain the electrical characteristics (such as reverse breakdown voltages, threshold voltages, single particle burnout voltages, etc.) of the wide bandgap power device 50 under different sensitive conditions after pulse laser irradiation.

Specifically, the signal access selection unit 302 includes three gate signal control switches G1, G2, G3, three drain signal control switches D1, D2, D3, and three source signal control switches S1, S2, S3. One end of each of the gate signal control switches, the drain signal control switches, and the source signal control switches of the signal access selection unit 302 is accessed to the dynamic test unit 303, the transient current test unit 304, and the electrical characteristic test unit 305, respectively. The other ends of the three gate signal control switches G1, G2, and G3 are connected together to a Gate port of the probe station 60. The other ends of the three drain signal control switches D1, D2, and D3 are connected together to a Drain port of the probe station 60. The other ends of the three source signal control switches S1, S2, and S3 are connected together to a Source port of the probe station 60. Three probes of the probe station 60 are connected to the gate, the drain, and the source of the wide bandgap power device 50 respectively. The electrical characteristic test unit 305 is an IV test source meter, which is connected to the operation control unit 402 through a data line to achieve direct communication.

The transient current test unit 304 includes a bias tee circuit 3041 and a numerical control voltage source 3042. The bias tee circuit 3041 includes a gate bias tee circuit, a drain bias tee circuit, and a source bias tee circuit. As shown in FIG. 4, an AC end of the gate bias tee circuit is connected to a first channel CH1 of the waveform acquisition unit 306, a DC end of the gate bias tee circuit is connected to a first channel CH1 of the numerical control voltage source 3042, and a COM end of the gate bias tee circuit is connected to the gate signal control switch G2 of the signal access selection unit 302. An AC end of the drain bias tee circuit is connected to a second channel CH2 of the waveform acquisition unit 306, a DC end of the drain bias tee circuit is connected to a second channel CH2 of the numerical control voltage source 3042, and a COM end of the drain bias tee circuit is connected to the drain signal control switch D2 of the signal access selection unit 302. An AC end of the source bias tee circuit is connected to a third channel CH3 of the waveform acquisition unit 306, a DC end of the source bias tee circuit is connected to a GND, and a COM end of the source bias tee circuit is connected to the source signal control switch S2 of the signal access selection unit 302.

As a preferred implementation, the drive control unit 301 consists of three paths of isolated power supplies and three paths of drive chips, where all of the three paths of isolated power supplies are powered by a VCC, and the three paths of drive chips are powered by their respective isolated power supplies to ensure electrical isolation. An IO9 pin of the FPGA 401 is connected to a PWM_IN pin of a drive chip 1, an IO10 pin is connected to a PWM_IN pin of a drive chip 2, an IO11 pin is connected to a PWM_IN pin of a drive chip 3, and a photocoupler is integrated inside the drive chips, which can output signals OUT in three paths to achieve electrical isolation. The signal access selection unit 302 consists of nine enhanced MOS transistors with low on-resistance, and gate source (GS) control signals of each MOS transistor are isolated and output through the drive control unit 301. The drive chip 1 simultaneously controls the gate signal control switch G1, the drain signal control switch D1, and the source signal control switch S1, so that the wide bandgap power device 50 is accessed to the electrical characteristic test unit 305 to perform an electrical characteristic test. The drive chip 2 simultaneously controls the gate signal control switch G2, the drain signal control switch D2, and the source signal control switch S2, so that an SMU1 port of the electrical characteristic test unit 305 is connected to the source of the gate signal control switch G1, an SMU2 port is connected to the source of the drain signal control switch D1, and a GND port is connected to the source of the source signal control switch S1, thereby controlling the SUM1 port and the SMU2 port to apply test signals to the gate and the drain of the wide bandgap power device 50 to perform an electrical characteristic test. The drive chip 3 simultaneously controls the gate signal control switch G3, the drain signal control switch D3, and the source signal control switch S3, so that three ends of the wide bandgap power device 50 are accessed to the COM ports of the gate bias tee circuit, the drain bias tee circuit, and the source bias tee circuit respectively. The two DC ports of the gate bias tee circuit and the drain bias tee circuit are connected to the first channel CH1 and the second channel CH2 of the numerical control voltage source 3042 through a current limiting resistor, while the DC port of the source bias tee circuit is connected to the GND. The AC ports of the gate bias tee circuit, the drain bias tee circuit, and the source bias tee circuit are connected to the three channels CH1, CH2, and CH3 of the waveform acquisition unit 306, respectively. Specifically, the waveform acquisition unit 306 is an oscilloscope.

The dynamic switching test unit 303 includes a complementary push-pull drive circuit and a power inductor, and is triggered and controlled by the output signal of the IO8 pin of the FPGA 401. The complementary push-pull drive circuit consists of an NPN transistor and a PNP transistor. The IO8 pin of the FPGA 401 is connected to an input end of the complementary push-pull drive circuit, and an output end of the complementary push-pull drive circuit is connected to the source of the gate signal control switch G3 of the signal access selection unit 302. One end of the power inductor is connected to the VCC and the other end thereof is accessed to the source of the drain signal control switch D3 and the source of the source signal control switch S3. An overvoltage pulse can be applied to the wide bandgap power device 50 by using this dynamic circuit. If the wide bandgap power device 50 has an avalanche capability, a process of avalanche energy release can also be observed.

Figure 5:
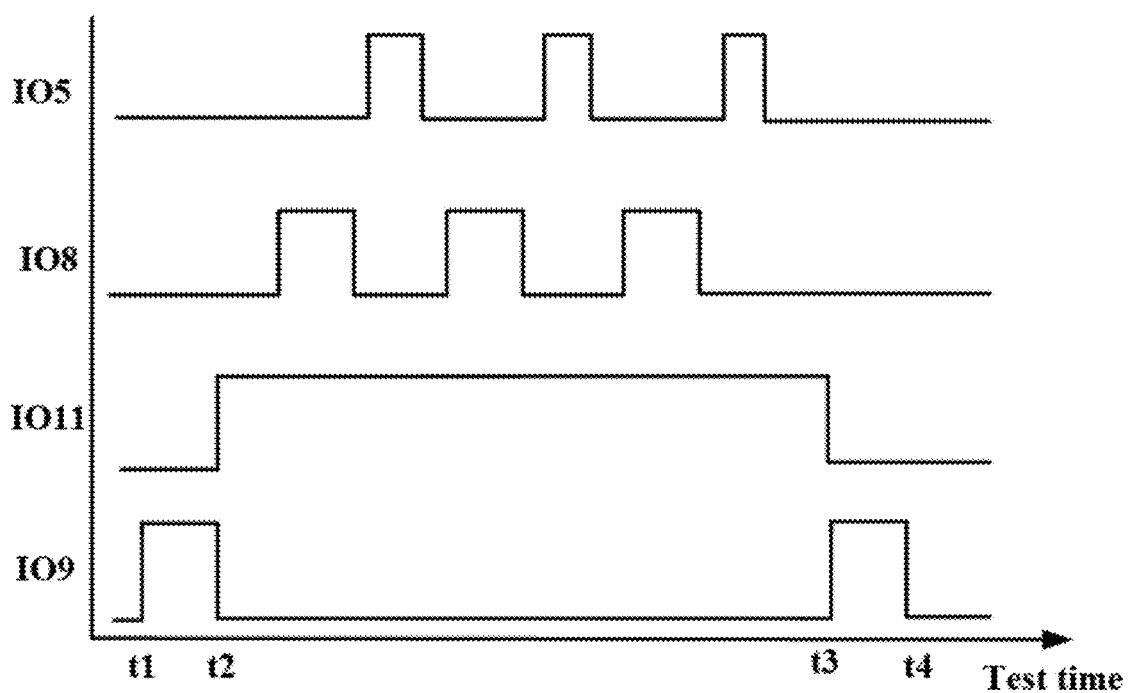
FIG. 5 is a sequence diagram of an FPGA signal under a dynamic switching test.

In this embodiment, FIG. 5 shows a sequence diagram of FPGA control signals when performing a dynamic switching test. Before a moment t1, the wide bandgap power device 50 is always in a switch-on state, waiting for a test. At moments t1 to t2, only the output of the 19 pin of the FPGA 401 is at a high level, and at this time, the drive chip 1 accesses the gate signal control switch G1, the drain signal control switch D1, and the source signal control switch S1 to the electrical characteristic test unit 305. At the same time, the operation control unit 402 controls the electrical characteristic test unit 305 to perform an electrical characteristic scanning test. At moments t2 to t3, the output of the 19 pin of the FPGA 401 is at a low level, the output of the IO11 pin is at a high level, and at this time, the drive chip 3 accesses the gate signal control switch G3, the drain signal control switch D3, and the source signal control switch S3 to the dynamic switching test unit 303. At the same time, the IO8 pin outputs three high-level pulses, and drives the wide bandgap power device 50 through the complementary push-pull circuit to perform a dynamic switching test. During a period of time after the end of each high-level pulse output by the IO8 pin of the FPGA 401, the IO5 pin outputs a high level, thus controlling the trigger of the pulse laser device. At moments t3 to t4, only the IO9 pin of the FPGA 401 outputs a high level to perform an electrical characteristic test after irradiation.

The waveform acquisition unit 306 is configured to acquire a pulse current waveform under a set pulse laser emission mode output when the dynamic switching test unit 303 performs a dynamic switching test, and to acquire a transient pulse current waveform under a set gate voltage and drain voltage output when the transient current test unit 304 performs a transient current test. The waveform acquisition unit 306 is a multi-channel high-bandwidth oscilloscope, a fifth channel, a sixth channel, and a seventh channel thereof are connected to the dynamic switching test unit 303 through test probes, and the waveform acquisition unit 306 communicates directly with the operation control unit 402 through a data line so as to control the waveform acquisition unit 306 to perform waveform acquisition.

Based on the above experimental apparatus, the present invention provides a test method for a pulse laser irradiation wide bandgap power device, including the following steps:

S1: a test preparation phase: turning on a chip illumination LED, an environment illumination LED, and a microscope camera, placing a wide bandgap power device 50 in a cavity, manually adjusting a piezoelectric displacement unit 103 by a tester to focus pulse laser onto a surface of the wide bandgap power device 50, and accessing a gate, a drain, and a source of the wide bandgap power device 50 to a test apparatus using a probe station 60;

S2: presetting, by the tester, test conditions in an operation control unit 402, where the test conditions include: a pulse laser wavelength, frequency, single pulse energy, a position of a rectangular region for scanning, a step size interval, and bias conditions of an electrical characteristic test unit 305;

S3: clicking, by the tester, a sensitive region scanning test button, accessing the wide bandgap power device 50 to a circuit test system 30, enabling a pulse laser device of a pulse laser control unit 101 to be switched on, enabling a piezoelectric displacement unit 103 to perform scanning according to the rectangular region and the step size set in step S2 simultaneously, enabling the electrical characteristic test unit 305 to acquire gate current and source current of the wide bandgap power device 50 in real time simultaneously, and after completing a test, saving scanning images and data of a gate sensitive region and a drain sensitive region, and automatically locating a position of the drain sensitive region;

S4: setting, by the tester, magnitudes of a gate voltage and a drain voltage of the wide bandgap power device 50, and clicking a transient current test button, allowing that the pulse laser device receives a signal from the FPGA 401 to perform a single trigger at this time, and a waveform acquisition unit 306 performs a single capture simultaneously to obtain a high-frequency pulse current waveform under this gate voltage and drain voltage; and changing the gate voltage and the drain voltage, and repeating the above operation to obtain transient photocurrent waveforms at different voltages;

S5: performing again, by the tester, sensitive condition tests, specifically including a sensitive wavelength test, a sensitive focusing depth test, a sensitive single pulse energy test, a sensitive bias voltage test, and a sensitive temperature test:

clicking a sensitive wavelength test button, enabling the pulse laser device to change the wavelength based on a bandgap width range of the wide bandgap power device 50, and simultaneously, enabling the electrical characteristic test unit 305 to acquire the magnitudes of the gate current and drain current of the wide bandgap power device 50 at different wavelengths to determine a sensitive wavelength;

clicking a sensitive focusing depth test button, enabling the pulse laser device to change a focusing depth of the pulse laser based on a set Z-axis movement range, and simultaneously, enabling the electrical characteristic test unit 305 to acquire the magnitudes of the gate current and the drain current of the wide bandgap power device 50 at different wavelengths to determine a sensitive focusing depth;

clicking a sensitive single pulse energy test button, enabling the energy control unit 102 to switch different attenuation plates, and simultaneously, enabling the electrical characteristic test unit 305 to acquire the magnitudes of the gate current and the drain current of the wide bandgap power device 50 at different wavelengths to determine sensitive single pulse energy;

clicking a sensitive bias voltage test button, setting a range of gate voltages and drain voltages to be tested, enabling the electrical characteristic test unit 305 to scan the gate voltages and the drain voltages, respectively, and simultaneously, enabling the electrical characteristic test unit 305 to acquire the magnitudes of the gate current and the drain current of the wide bandgap power device 50 at different wavelengths to determine a sensitive bias voltage; and clicking a sensitive temperature test button, setting a temperature range to be tested, enabling the temperature control unit 102 to change different temperatures, and simultaneously, enabling the electrical characteristic test unit 305 to acquire the magnitudes of the gate current and the drain current of the wide bandgap power device 50 at different wavelengths to determine a sensitive temperature;

S6: before and after performing the sensitive condition test in step S5, accessing the wide bandgap power device 50 to the electrical characteristic test unit 305 to perform an electrical characteristic scanning test, and further obtaining degradation conditions of electrical characteristics (such as magnitudes of gate current and drain current, magnitudes of a reverse breakdown voltage and a threshold voltage, a single particle burnout voltage, etc.) of the wide bandgap power device 50 under different sensitive conditions;

S7: clicking, by the tester, a dynamic switching test, and accessing the wide bandgap power device 50 to the dynamic switching test unit 303; if a single dynamic switching test is selected, enabling the pulse laser device and the drive control unit 301 to perform a single trigger, and simultaneously, enabling the waveform acquisition unit 306 to perform a single capture so as to determine whether the wide bandgap power device 50 fails, namely, whether the wide bandgap power device is damaged, by observing the waveform; and if the wide bandgap power device 50 is normal, continuing to perform continuous dynamic switching tests, enabling the drive control unit 301 to send a PWM wave, enabling the pulse laser device to trigger at the same frequency, and simultaneously, enabling the waveform acquisition unit 306 to perform continuous acquisition so as to obtain irradiation resistance of the wide bandgap power device 50 under the dynamic switching tests; and S8: after accessing to the wide bandgap power device 50, completing all of the above-mentioned test processes as well as viewing and analyzing all experimental data (such as a single particle burnout voltage, magnitudes of drain current and gate current, etc.) by the tester through an interaction control system 40, to determine the irradiation resistance of the wide bandgap power device 50 under the pulse laser. For example, if the single particle burnout voltage is low and the drain current increases, it represents that the irradiation resistance is poor, and otherwise, it represents that the irradiation resistance is good. If the wide bandgap power device 50 fails in a certain test process, the wide bandgap power device 50 can be replaced, and the above steps can be repeated.

All test steps described in steps S1 to S8 can be fully-automatically performed according to the processes, and at the same time, the entire 8-inch wafer can be directly placed in the cavity of the temperature control system 20, the probe station can test the wide bandgap power devices 50 one by one, if a current wide bandgap power device 50 fails, then, all current experimental data will be saved and a next wide bandgap power device 50 can be directly switched to, until the tests of all wide bandgap power devices 50 are completed.

The contents not described in detail in this specification belong to the prior art known to those skilled in the art.

Finally, it should be noted that the above specific implementations are merely used to illustrate the technical solutions of the present patent rather than limit thereto. Although the present patent has been described in detail with reference to preferred embodiments, those of ordinary skill in the art should understand that modifications or equivalent replacements may be made to the technical solutions of the present patent without departing from the spirit and scope of the technical solutions of the present patent, and these modifications or equivalent replacements shall fall within the scope of the claims of the present patent.

What is claimed is:

1. An experimental apparatus for a pulse laser irradiation wide bandgap power device, comprising an optical path coupling system, a circuit test system, a temperature control system, and an interaction control system, wherein the optical path coupling system directs pulse laser onto a surface of a wide bandgap power device to be tested through an optical path and is configured to regulate parameters of the pulse laser, control an incident position of the pulse laser, and feed back an image of a surface morphology of the wide bandgap power device;

the circuit test system is electrically connected to a gate, a drain, and a source of the wide bandgap power device through three probe stations respectively, and is configured to monitor electrical characteristics of the wide bandgap power device, capture irradiation transient pulse current, and perform a dynamic switching test before and after irradiation;

the temperature control system, with the wide bandgap power device being placed in a cavity therein, is configured to control an environmental vacuum degree and temperature of the wide bandgap power device;

the interaction control system is connected to each of the optical path coupling system, the circuit test system, and the temperature control system through a communication cable respectively, and is configured to send a test instruction and acquire and feed back test data and images;

the optical path coupling system comprises a pulse laser control unit, an energy control unit, an image acquisition unit, and a piezoelectric displacement unit;

the pulse laser control unit comprises a pulse laser device and is configured to control the pulse laser device to emit the pulse laser;

the energy control unit comprises a motor drive circuit and an attenuation plate switching motor, and is configured to adjust a magnitude of single pulse energy; the piezoelectric displacement unit is configured to control scanning of a sample in X-axis and Y-axis directions at a horizontal position and control a focusing depth of the sample;

the image acquisition unit comprises a microscope camera, a chip illumination LED, and an environment illumination LED and is configured to provide an illumination environment and acquire images;

the circuit test system comprises a drive control unit, a signal access selection unit, a dynamic switching test unit, a transient current test unit, an electrical characteristic test unit, and a waveform acquisition unit;

the dynamic switching test unit comprises a complementary push-pull circuit composed of an NPN transistor and a PNP transistor, and an output end of the dynamic switching test unit is connected to the signal access selection unit and applies a voltage pulse to the wide bandgap power device based on an access signal; and the transient current test unit comprises a gate bias tee circuit, a drain bias tee circuit, a source bias tee circuit and a numerical control voltage source; an AC end of the gate bias tee circuit is connected to the waveform acquisition unit, a DC end thereof is connected to the numerical control voltage source, and a COM end thereof is connected to a gate control signal switch of the signal access selection unit; an AC end of the drain bias tee circuit is connected to the waveform acquisition unit, a DC end thereof is connected to the numerical control voltage source, and a COM end thereof is connected to a drain control signal switch of the signal access selection unit; and an AC end of the source bias tee circuit is connected to the waveform acquisition unit, a DC end thereof is connected to a GND, and a COM end thereof is connected to a source control signal switch of the signal access selection unit.

2. The experimental apparatus for the pulse laser irradiation wide bandgap power device according to claim 1, wherein the temperature control system comprises a temperature control unit and a vacuum degree control unit;

the temperature control unit comprises a heating table, and is configured to control an environmental temperature in the cavity where the wide bandgap power device is located; and the vacuum degree control unit comprises a vacuum pump, and is configured to control an environmental vacuum degree in the cavity where the wide bandgap power device is located.

3. The experimental apparatus for the pulse laser irradiation wide bandgap power device according to claim 1, wherein the interaction control system comprises an FPGA and an operation control unit, the operation control unit is configured to acquire a test instruction from a tester, and the FPGA communicates with the operation control unit through a serial port and is connected to the optical path coupling system and the circuit test system through pins for sending a control instruction to units connected to each pin.

4. The experimental apparatus for the pulse laser irradiation wide bandgap power device according to claim 3, wherein the drive control unit is connected to the wide bandgap power device through the three probe stations, and outputs a gate drive signal, a drain drive signal, and a source drive signal to the signal access selection unit based on the control instruction to control the wide bandgap power device which is connected to the signal access selection unit to access to the dynamic switching test unit, the transient current test unit, or the electrical characteristic test unit.

5. The experimental apparatus for a pulse laser irradiation wide bandgap power device according to claim 3, wherein the electrical characteristic test unit is an IV test source meter, which is connected to and communicates with the operation control unit through a data line.

\* \* \* \* \*